(12) United States Patent
Takahashi et al.

(10) Patent No.: US 12,573,584 B2
(45) Date of Patent: Mar. 10, 2026

(54) STAGE DEVICE, CHARGED PARTICLE BEAM DEVICE, AND VACUUM DEVICE

(71) Applicant: Hitachi High-Tech Corporation, Tokyo (JP)

(72) Inventors: Motohiro Takahashi, Tokyo (JP); Masaki Mizuochi, Tokyo (JP); Takanori Kato, Tokyo (JP); Akira Nishioka, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 523 days.

(21) Appl. No.: 18/296,103

(22) Filed: Apr. 5, 2023

(65) Prior Publication Data

US 2023/0369011 A1 Nov. 16, 2023

(30) Foreign Application Priority Data

May 13, 2022 (JP) ................................. 2022-079130

(51) Int. Cl.
*H01J 37/20* (2006.01)
*H01J 37/18* (2006.01)

(52) U.S. Cl.
CPC .............. *H01J 37/20* (2013.01); *H01J 37/18* (2013.01); *H01J 2237/20292* (2013.01); *H01J 2237/24578* (2013.01)

(58) Field of Classification Search
CPC .... H01J 37/18; H01J 37/20; H01J 2237/2817; H01J 2237/20292; H01J 2237/28; H01J 2237/24578; G01N 23/2204
See application file for complete search history.

(56) References Cited

U.S. PATENT DOCUMENTS

| | | | |
|---|---|---|---|
| 4,782,236 A | * 11/1988 | Chitayat | .................. B23Q 3/18 250/491.1 |
| 2015/0248991 A1 | * 9/2015 | Ogawa | ............... G01B 9/02021 250/491.1 |

FOREIGN PATENT DOCUMENTS

JP 2015-162396 A 9/2015

* cited by examiner

*Primary Examiner* — David E Smith
*Assistant Examiner* — Hsien C Tsai
(74) *Attorney, Agent, or Firm* — Volpe Koenig

(57) ABSTRACT

A stage device includes: a sample installation unit in which a positioning target is installed; a scale plate used to measure displacement of the sample installation unit in a vertical direction; and a lower axis table configured to support the scale plate. A free support unit is provided between the scale plate and the lower axis table.

11 Claims, 9 Drawing Sheets

STAGE DEVICE, CHARGED PARTICLE BEAM DEVICE, AND VACUUM DEVICE

CLAIM OF PRIORITY

The present application claims priority from Japanese Patent application serial No. 2022-079130, filed on May 13, 2022, the content of which is hereby incorporated by reference into this application.

BACKGROUND OF THE INVENTION

1. Field of the Invention

The present disclosure relates to a stage device, a charged particle beam device, and a vacuum device.

2. Description of Related Art

In the related art, technologies related to device stages for semiconductor-related devices and stages positioning wafers accurately and supporting the wafers are known.

In particular, in stages in vacuum, positioning accuracy by contactless support and 6-axes control is improved by applying magnetic levitation guide. In the magnetic levitation guide, in addition to position measurement in a straight direction of the X axis, it is necessary to measure and control a position in the Y axis direction and the Z axis direction and a position and posture in a 5-axes direction of a posture at rotational angles Rx, Ry, and Rz around 3 axes.

JP2015-162396A discloses that a second position detection device detects a position of a sample stage when the sample stage is located in a part of a stage movement range which can be detected by a first position detection device that detects a position of the sample stage, and a stage device that adjusts an offset amount of the first position detection device based on a position detection result obtained by the second position detection device is used, and thus miniaturization of a mirror and highly accurate position detection can be compatible. Here, in the first position detection device, an example in which a mirror is disposed on a table and a laser interferometer is disposed on a lateral surface of a sample chamber is shown. In the second position detection device, for example, an absolute scale is disposed on the table and an absolute scale detector is disposed in the sample chamber. The second position detection device is an absolute position detection device that measures an absolute amount of a distance between the sample stage and a base in which the sample stage is disposed. A Y table that can freely move in the Y direction via a Y linear guide is disposed on the base and an X table that can freely move in the X direction via two X linear guides is disposed on the Y table.

In processes such as manufacturing, measurement, and inspection of a semiconductor wafer, the stage device disclosed in JP2015-162396A is used to acutely position the semiconductor wafer. In the stage device, high position accuracy of a nanometer scale is required.

In particular, in a magnetic levitation stage in which a guide element is contactless, positioning is performed using a linear scale. However, a scale plate which is a position reference is bent due to a curvature caused by thermal deformation or the like of the Y table (a lower axis table) in which the scale plate is installed, and thus a posture error of the levitation stage may occur.

When the scale plate is installed on the lower axis table as in the stage device disclosed in JP2015-162396A, there is a problem that a posture error occurs in the X table (an upper axis table), that is, a levitation axis. In particular, when a movement speed of the stage is increased to improve a throughput, motor heating or friction heat increases, and thus thermal deformation of the table increases. That is, a posture error becomes more prominent due to thermal deformation of the lower axis table.

As a countermeasure against such problem, it is conceivable that thermal deformation is caused to be rarely transmitted by supporting the lower axis table through a spring or the like so that the scale plate is displaceable. However, since support stiffness of the scale plate deteriorates in a spring portion, vibration of the scale plate is a new problem.

Deformation of the lower axis table occurs due to distortion by movement or the like of a rolling element of the lower axis guide, or deformation of the sample chamber by a change in pressure. Thus a problem also occurs in that the scale plate is deformed.

SUMMARY OF THE INVENTION

An object of the present disclosure is to provide a stage device capable of reducing a posture error and performing positioning at a high speed, and a charged particle beam device and a vacuum device using the stage device.

According to an aspect of the present disclosure, a stage device includes: a sample installation unit in which a positioning target is installed; a scale plate used to measure displacement of the sample installation unit in a vertical direction; and a lower axis table configured to support the scale plate. A free support unit is provided between the scale plate and the lower axis table.

According to the present disclosure, it is possible to provide a stage device capable of reducing a posture error and performing positioning at a high speed, and a charged particle beam device and a vacuum device using the stage device.

DETAILED DESCRIPTION

Hereinafter, a stage device, a charged particle beam device, and a vacuum device according to an embodiment of the present disclosure will be described with reference to the drawings. Here, the vacuum device is a device configured to maintain a predetermined portion of a device in a depressurization state and includes a semiconductor measurement device.

Figure 1:
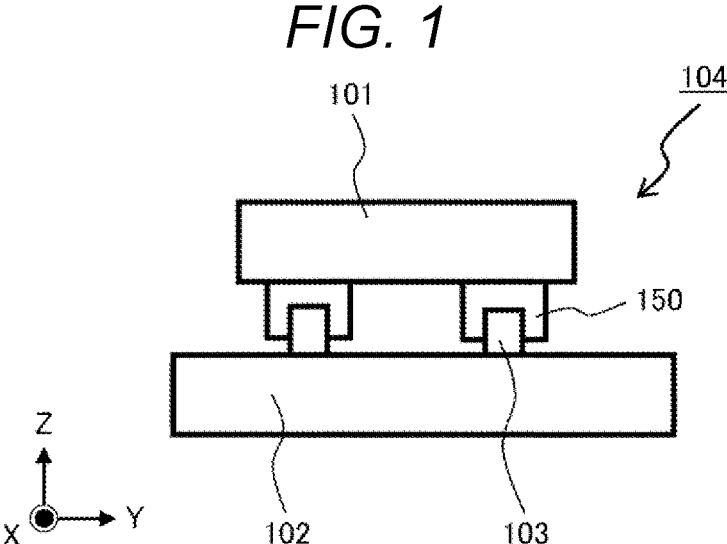
FIG. 1 is a side view illustrating a configuration of a stage.

FIG. 1 is a side view illustrating a configuration of a stage.

As illustrated in the drawing, a stage device 104 includes a table 101, a base 102, and a linear guide 103. The linear guide 103 is fixed onto the base 102. A carriage 150 is provided on the lower surface of the table 101. The carriage 150 is installed in the linear guide 103. In the present configuration, the table 101 can move in the X axis direction which is a direction perpendicular to the drawing.

Figure 2:
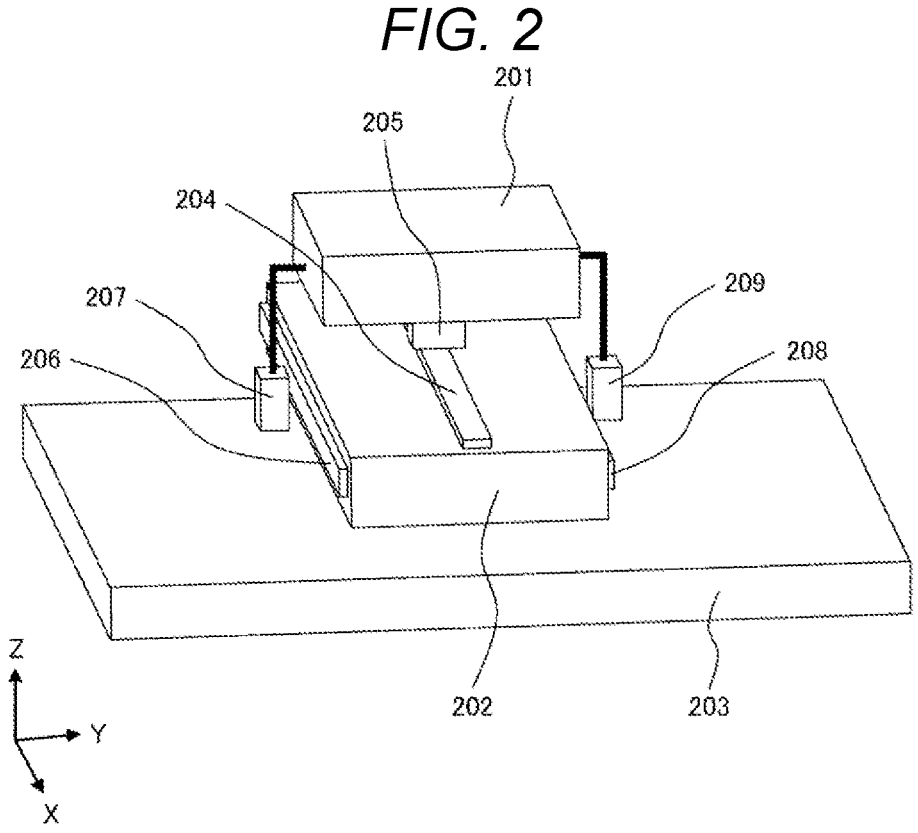
FIG. 2 is a perspective view illustrating an exemplary configuration of a stage of the related art.

FIG. 2 is a perspective view illustrating an exemplary configuration of a stage of the related art.

In the drawing, a stack type XY stage where the X axis is installed on the Y axis is illustrated. The XY stage illustrated in the drawing has a configuration in which uniaxial stages in FIG. 1 are superimposed in two stages. The base 102 in FIG. 1 corresponds to a base 203 in FIG. 2.

An X table 201 is installed to be able to move in the X axis direction with respect to a Y table 202. The Y table 202 is installed to be able to move in the Y axis direction with respect to the base 203. Accordingly, positioning in an XY plane is possible.

The X axis of the upper axis is applied to a magnetic levitation guide. The X table 201 is supported in a contactless manner on the Y table 202.

In a magnetic levitation stage, it is necessary to measure positions and postures of 6 axes of a levitation unit. Therefore, the positions and postures are measured by six linear scales. A linear scale is a position sensor that measures relative displacement between a scale plate and a scale head. The scale plate is a long glass plate and is generally installed to a fixing side of the stage. The scale head is installed on a movable side of the stage.

A scale head 205 is installed on a lower surface of the X table 201. A scale plate 204 is installed on the upper surface of the Y table 202. Both the scale plate 204 and the scale head 205 are used to measure a position in the X axis direction and the Y axis direction. Accordingly, a relative positional change in the X axis direction and the Y axis direction of the X table 201 and the Y table 202 can be measured.

A scale plate 206 is installed on one lateral surface of the Y table 202. A scale head 207 is installed on the upper surface of the base 203. The scale head 207 is installed in one support unit of the X table 201. The scale plate 206 and the scale head 207 are disposed to face each other. Similarly, a scale plate 208 is installed on a lateral surface of the Y table 202 on the opposite side. A scale head 209 is installed on the upper surface of the base 203. The scale head 209 is installed in the other support unit of the X table 201. The scale plate 208 and the scale head 209 are disposed to face each other. The scale plates 206 and 208 and the scale heads 207 and 209 are all used to measure a position in the Z axis direction. Accordingly, a relative positional change can be measured in the Z axis direction of the X table 201 and the Y tale 202. By calculating a difference between measurement values of the scale heads 207 and 209, it is possible to measure a posture change in a rotational direction around the X axis.

Figure 3:
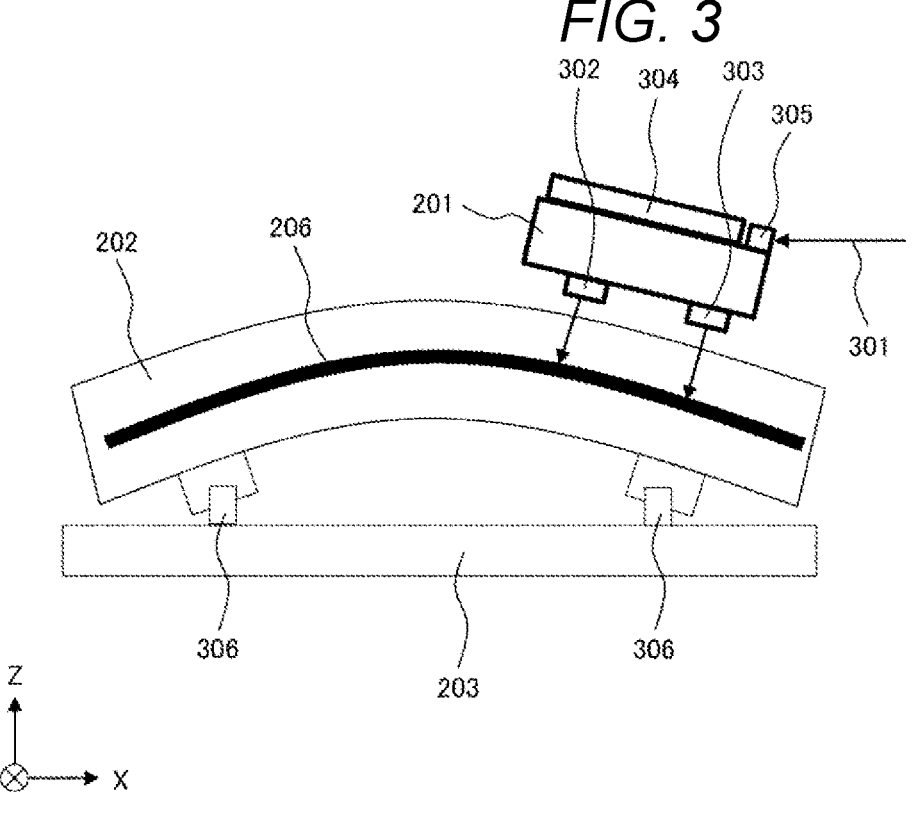
FIG. 3 is a schematic side view illustrating thermal deformation in the stage of the related art.

FIG. 3 is a schematic side view illustrating thermal deformation in the stage of the related art in FIG. 2.

In FIG. 3, a posture change of the X table 201 arises due to thermal deformation of the Y table 202.

When the stage is driven at a high speed, motor heating increases, and thus thermal deformation of the table occurs. In particular, when an increase in temperature of the Y table 202 in which the scale plate 206 is installed arises, thermal deformation such as the Y table 202 bulged in the Z axis direction (upward) occurs. The deformation depends on thermal expansion of the Y table 202 in the X axis direction in a state in which parts of the bottom surface of the Y table 202 are restrained by the linear guides 306. Accordingly, the scale plate 206 is also curved in an upward arched bulge.

A posture of the X table 201 around the Y axis is detected by measuring a distance in the Z axis direction between the scale plate 206 and each of the scale heads 302 and 303 used to measure a position in the Z axis direction. When the scale plate 206 is curved, an inclination arises in the X table 201. The position of the X table 201 is measured by irradiating a bar mirror 305 with a laser optical axis 301 from a laser interferometer.

Since there is a difference in height between irradiation points of the laser optical axis 301 of the bar mirror 305 and the upper surface of the sample 304, an Abbe error to be described below occurs. As such, positioning accuracy deteriorates due to deformation of the scale plate 206 caused by thermal deformation of a scale support unit.

The same phenomenon can arise due to distortion caused by movement or the like of a rolling element of a lower axis guide or deformation of a sample chamber caused by a pressure variation.

Next, an Abbe error and an occurrence principle of the Abbe error will be described.

Figure 4:
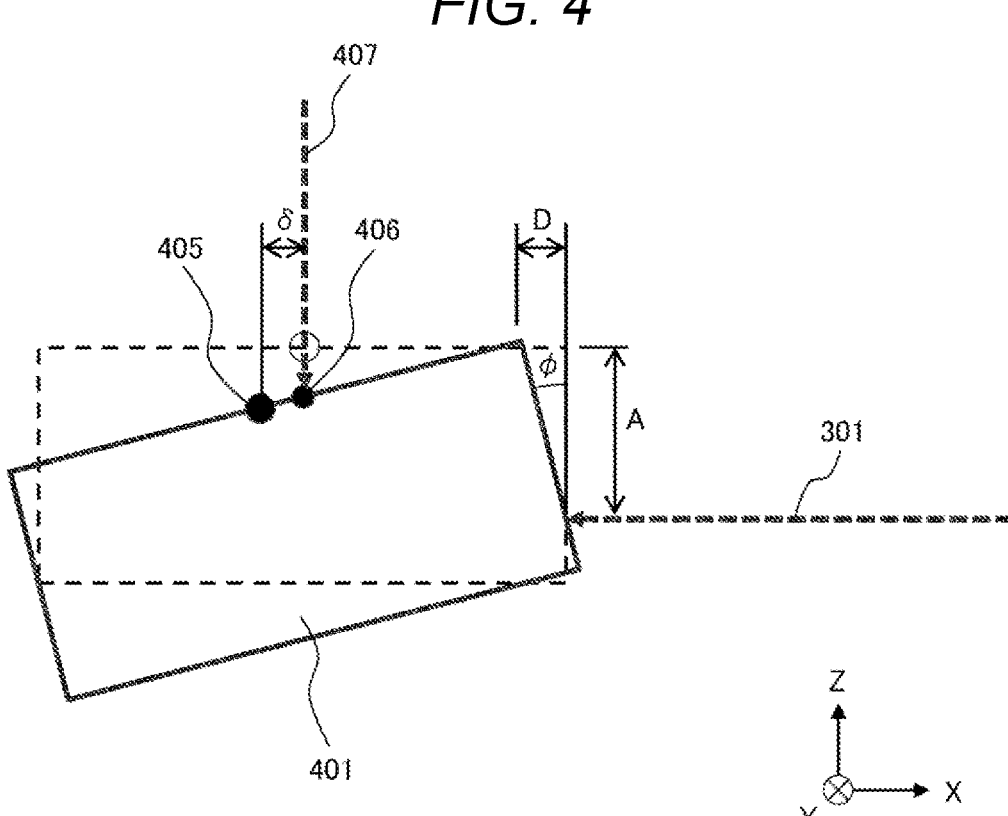
FIG. 4 is a schematic side view illustrating a principle of occurrence of an Abbe error.

FIG. 4 is a schematic side view illustrating a principle of occurrence of an Abbe error.

In the drawing, a rectangular solid 401 in which a table, a sample, and a mirror are formed by one rigid body is modeled. When A is a difference in height between a laser optical axis and a sample observation point and $\phi$ is inclination of the table, a positional deviation D of the observation point due to inclination of the table is expressed as $D=A \cdot \phi$.

The difference A in height is called "Abbe offset" and the positional deviation D is called an "Abbe error." In the case of a charged particle beam device, a beam irradiation point 406 of an electron beam 407 corresponding to an observation target point 405 located on the upper surface of the rectangular solid 401 which is a measurement and observation target deviates by the Abbe error D, and thus a visual deviation $\delta$ occurs.

Figure 5:
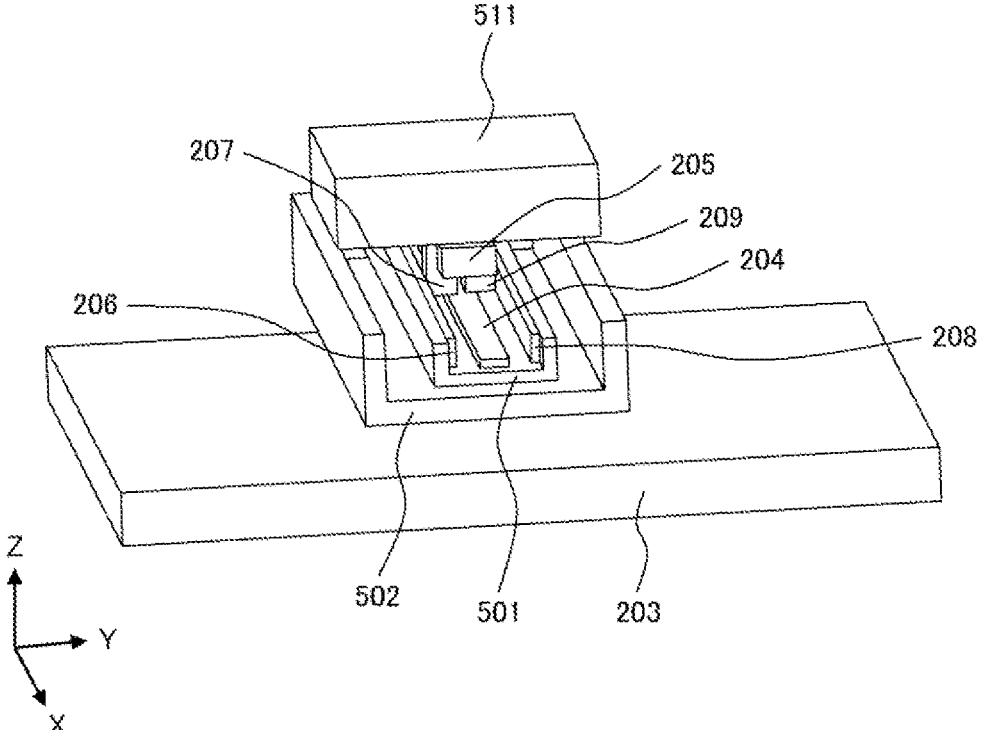
FIG. 5 is a perspective view illustrating an example of a stage device according to an embodiment.

FIG. 5 is a perspective view illustrating an example of a stage device according to the embodiment.

The stage device illustrated in the drawing has a scale tray structure which is a scale support structure.

In the drawing, the stage device includes the base 203, an Y table 502, a scale tray 501, and an X table 511 in order from the lower side. The Y table 502 has a U shape of which a cross section is upward opened and the scale tray 501 is installed in a depression portion. The scale tray 501 similarly has a U shape of which a cross section is upward opened. In the depression portion of the scale tray 501, scale plates 204, 206, and 208 are aggregated and fixed. The scale plate 204 is installed on the bottom of the depression portion of the scale tray 501. The scale plates 206 and 208 are located at positions facing lateral wall surfaces of the depression portion.

In the scale tray 501, seating surfaces of the scale plates 206 and 208 in the Z axis direction operate as ribs in the vertical direction and improve bending rigidity of the scale tray 501.

Figure 6:
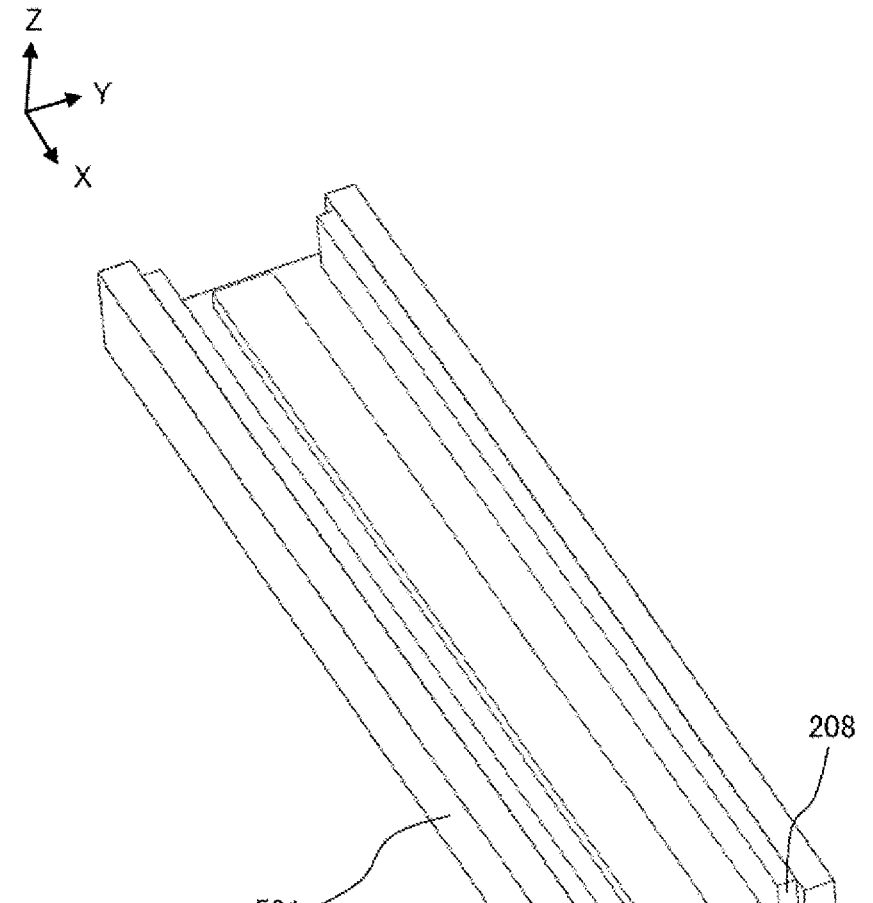
FIG. 6 is a perspective view illustrating a scale tray of FIG. 5.

FIG. 6 is a perspective view illustrating the scale tray 501 of FIG. 5.

As illustrated in FIG. 6, the scale plates 204, 206, and 208 are installed in the longitudinal direction (the X axis direction) of the scale tray 501.

Figures 7, 8A:
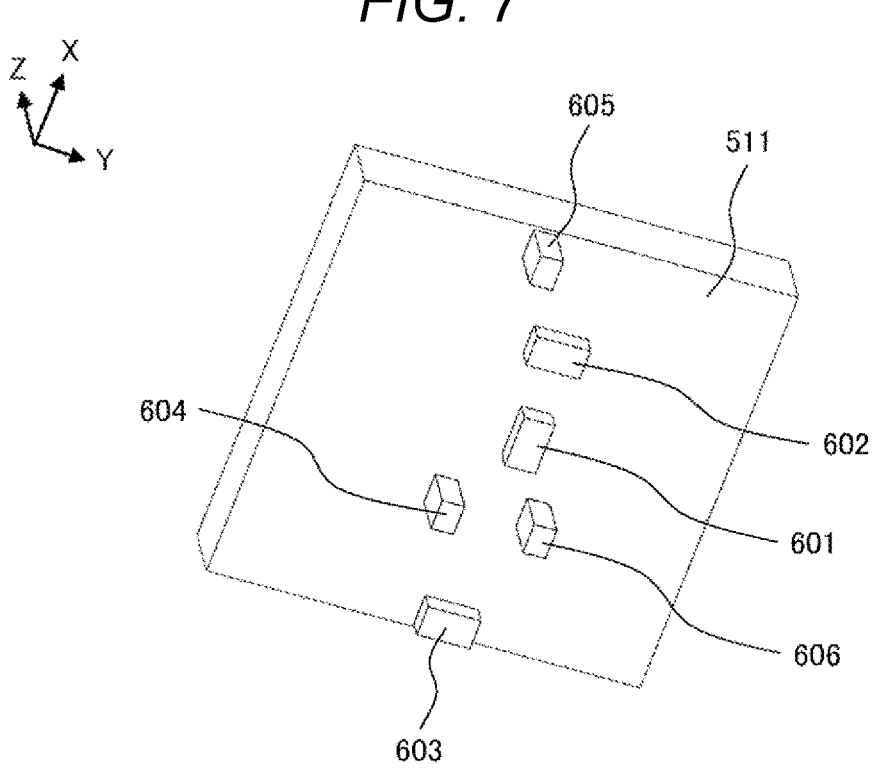
FIG. 7 is a perspective view illustrating an X table of FIG. 5.
FIG. 8A is a front view illustrating a state in which the scale tray and the X table of FIG. 5 are assembled.

FIG. 7 is a perspective view illustrating the X table 511 of FIG. 5.

As illustrated in FIG. 7, an X axis head 601, Y axis heads 602 and 603, and Z axis heads 604, 605, and 606 are installed on the lower surface of the X table 511.

FIG. 8A is a front view illustrating a state in which the scale tray 501 and the X table 511 of FIG. 5 are assembled.

In FIG. 8A, the scale plate 206 faces the Z axis head 605, the scale plate 208 faces the Z axis head 606, and the scale plate 204 faces the Y axis head 602.

Figure 8B:
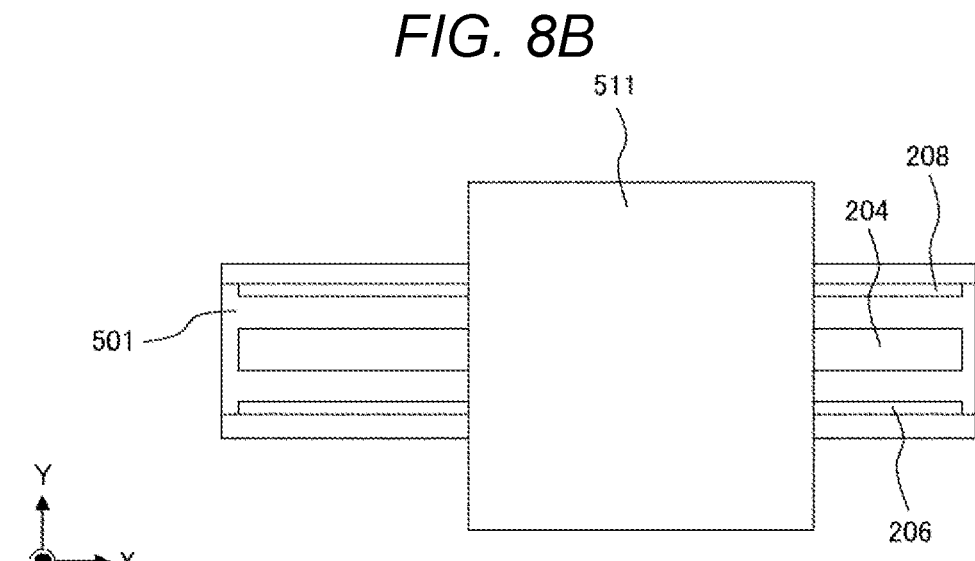
FIG. 8B is a top view illustrating the state in which the scale tray and the X table of FIG. 5 are assembled.

FIG. 8B is a top view illustrating the state in which the scale tray 501 and the X table 511 of FIG. 5 are assembled. In FIG. 8B, the X table 511 can move in the X axis direction.

Figure 9:
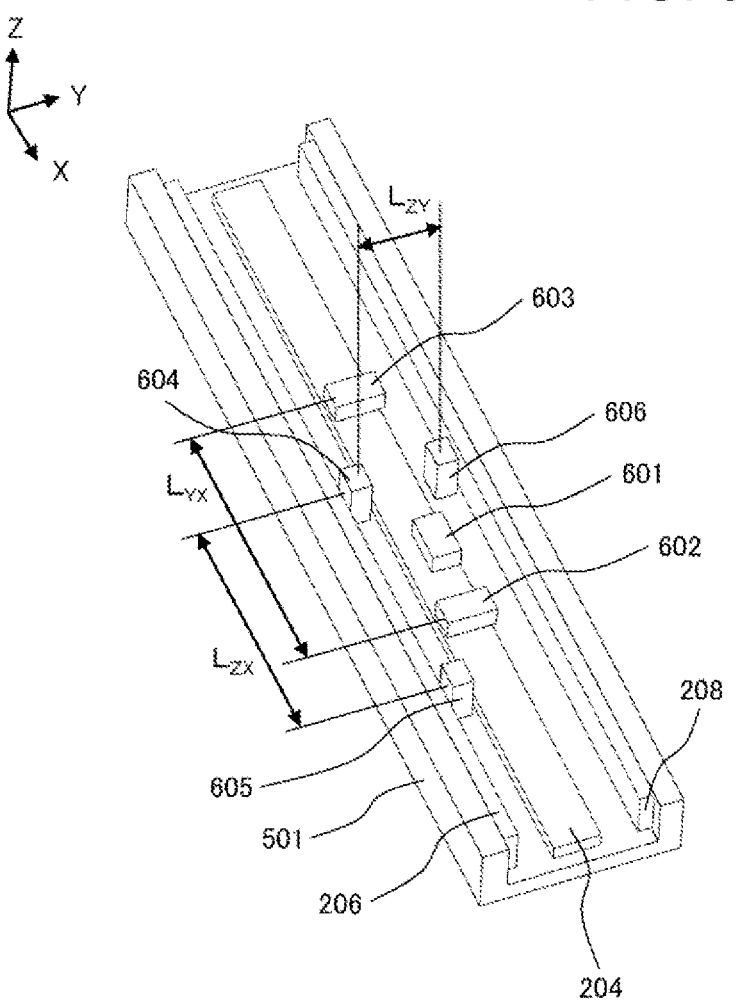
FIG. 9 is a perspective view illustrating an example of disposition of scale plates and heads for 6-axes measurement according to the embodiment.

FIG. 9 is a perspective view illustrating an example of disposition of scale plates and heads for 6-axes measurement according to the embodiment.

As illustrated in the drawing, the X table 511 is removed so that the X axis head 601, the Y axis heads 602 and 603, and the Z axis heads 604, 605, and 606 installed on the lower surface of the X table 511 are seen.

LYX is a distance between the Y axis head 602 and the Y axis head 603 in the X axis direction, LZY is a distance between the Z axis head 604 and the Z axis head 606 in the Y axis direction, and LZX is a distance between the Z axis heads 604 and 605 in the X axis direction.

The scale plate 204 is used to measure a position in two directions of the X axis direction and the Y axis direction. A position of the X table in the X axis direction with respect to the Y table is measured from relative displacement between the X axis head 601 and the scale plate 204. When $Y1$ is relative displacement between the Y axis head 602 and the scale plate 204 and $Y_2$ is relative displacement between the Y axis head 603 and the scale plate 204, the displacement Y of the X table in the Y axis direction with respect to the Y table is obtained with the following Expression (1).

$$Y=(Y_1+Y_2)/2 \tag{1}$$

A rotational angle $R_z$ of the X table around the Z axis with respect to the Y table is obtained with the following Expression (2).

$$R_z=(Y_2-Y_1)/L_{YX} \tag{2}$$

When $Z_1$ is relative displacement between the Z axis head 604 and the scale plate 206, $Z_2$ is relative displacement between the Z axis head 605 and the scale plate 206, and $Z_3$ is relative displacement between the Z axis head 606 and the scale plate 208, displacement Z of the X table in the Z axis direction with respect to the Y table is obtained with the following Expression (3).

$$Z=(Z_1+Z_2+Z_3)/3 \tag{3}$$

A rotational angle $R_X$ of the X table around the X axis with respect to the Y table is obtained with the following Expression (4).

$$R_X=(Z_3-Z_1)/L_{ZY} \tag{4}$$

A rotational angle $R_Y$ of the X table around the Y axis with respect to the Y table is obtained with the following Expression (5).

$$R_Y=(Z_1-Z_2)/L_{ZX} \tag{5}$$

Figure 10:
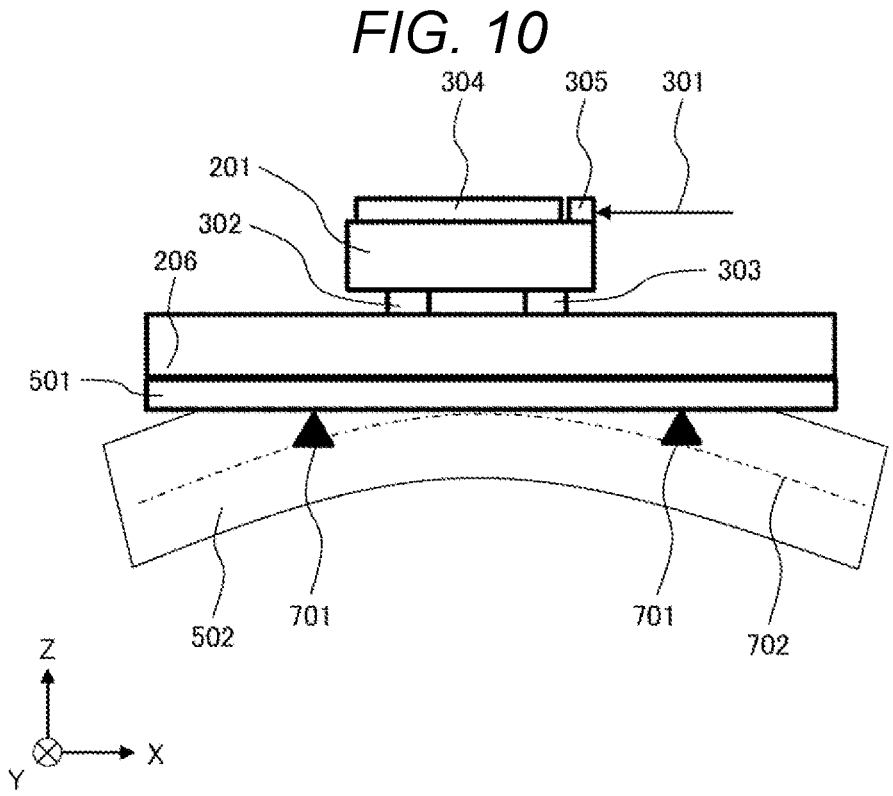
FIG. 10 is a sectional view illustrating a scale tray structure on an XZ plane according to the embodiment.

FIG. 10 is a sectional view illustrating a scale tray structure on an XZ plane according to the embodiment. Since the drawing is a sectional view, only one scale is illustrated.

In the drawing, the scale tray 501 is installed on the Y table 502. The X table 201 is installed above the scale tray 501. Two elastic support members 701 are installed between the Y table 502 and the scale tray 501. In other words, the scale tray 501 is supported at two points via the elastic support members 701. Accordingly, even when the Y table 502 is curved, as illustrated in the drawing, bending deformation of the Y table 502 is not transmitted to the scale tray 501, shape deformation of the scale plate 206 is prevented, and linearity is maintained. Accordingly, an inclination of the X table 201 is inhibited, and thus a visual deviation can also be inhibited due to the above-described Abbe error. Even when the Y table 502 is curved, neither condensation nor stretchiness occurs at a neural axis 702 of the Y table 502.

The elastic support members 701 may be implemented as non-separate elements when parts of the scale tray 501 or the Y table 502 protrudes in a bulge form. In other words, the elastic support members 701 may be formed as parts of the scale tray 501 or the Y table 502. Here, it is preferable to form separate components since the advantage that deformation is not transmitted to other components is obtained.

The scale tray 501 and the Y table 502 are preferably manufactured of materials that have at least close coefficients of linear expansion by matching the materials of the scale tray 501 and the Y table 502. Accordingly, it is possible to inhibit a curving state of the scale tray 501 because of the bimetal effect by a difference between the coefficients of linear expansion of both the scale tray and the Y table.

When the materials that have the close coefficients of linear expansion are used, as described above, the elastic support members 701 are manufactured of a material that has a high heat transfer property and a difference in temperature between the scale tray 501 and the Y table 502 can be effectively decreased.

Figure 11:
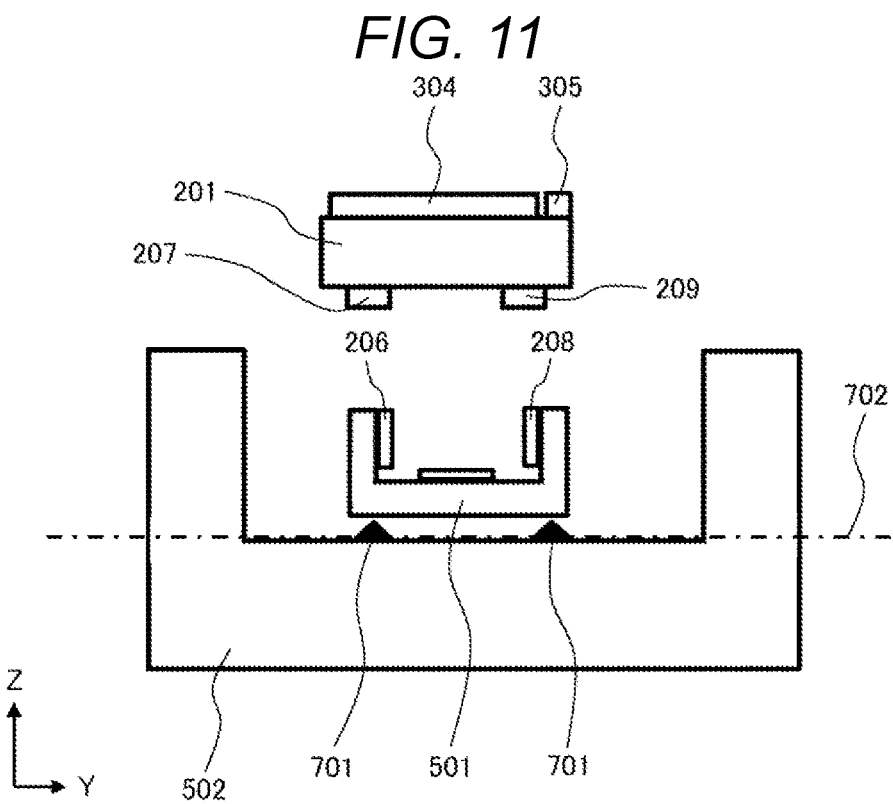
FIG. 11 is a sectional view illustrating the scale tray structure on a YZ plane according to the embodiment.

FIG. 11 is a sectional view illustrating the scale tray structure on a YZ plane according to the embodiment.

In the drawing, the scale tray 501 is installed in the depression portion of the Y table 502. The elastic support members 701 can be disposed on the neural axis 702 of the Y table 502. That is, in the neural axis 702, neither condensation stress nor stretchiness stress occurs during bending deformation. As described with reference to FIG. 10, even when the Y table 502 is curved, neither condensation nor stretchiness occurs on the neural axis 702. Therefore, a gap between the elastic support members 701 in the X axis direction is not changed. Accordingly, it is possible to prevent shape deformation such as distortion of the scale tray 501.

According to the foregoing operation, even when the table 502 (a lower axis table) is deformed by deformation of the sample chamber due to motor heating, guide distortion, or a change in pressure, it is possible to prevent deformation of the scale plate.

Figure 12:
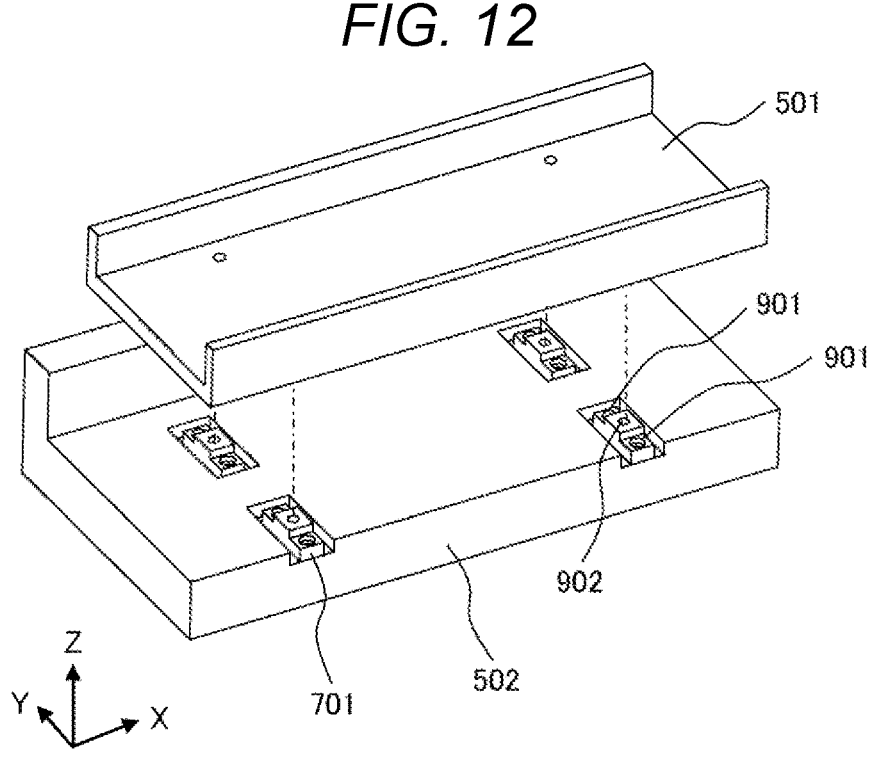
FIG. 12 is a perspective view illustrating an example of a detailed structure of an elastic support unit of the scale tray.

FIG. 12 is a perspective view illustrating a detailed structure of an elastic support unit of the scale tray.

In the drawing, four elastic support members 701 are installed on the upper surface of the Y table 502. The scale tray 501 is installed on the elastic support members 701. The elastic support members 701 are fixed to the Y table 502 by bolts inserted into connection bolt holes 901. A connection bolt hole 902 is installed in a middle portion of the elastic support members 701. The scale tray 501 is fixed to the elastic support members 701 by the bolts inserted into the connection bolt holes 902. Two connection bolt holes 901 of the elastic support members 701 are disposed to be arranged side by side in the Y axis direction. Accordingly, the Y table 502 is easily deformed around the Y axis direction.

As illustrated in the drawing, the elastic support members 701 may be embedded through excavations (recessed portions) of the Y table 502. As such, an excavation amounts of the U shape of the Y table 502 can be reduced by the height of the elastic support members 701 to guarantee bending rigidity of the Y table 502.

Figure 13:
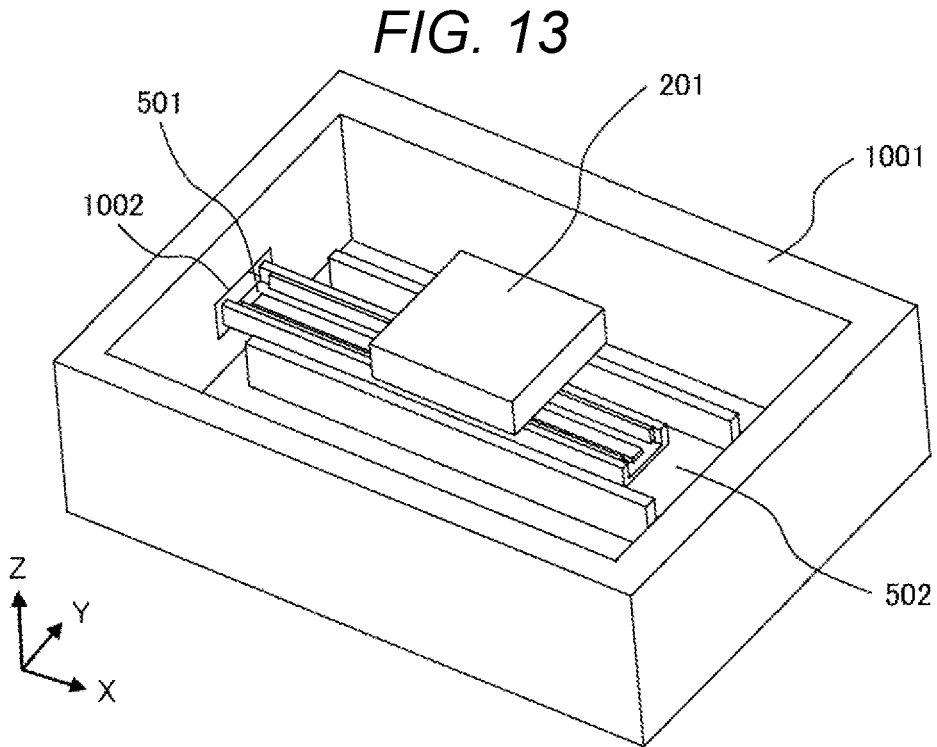
FIG. 13 is a perspective view illustrating a modified example of a sample chamber.

FIG. 13 is a perspective view illustrating an example of a configuration in which a maintenance hatch is provided for exchange for each scale tray.

In the drawing, a maintenance hatch 1002 used to exchange the scale tray 501 is provided on a lateral wall of a sample chamber 1001. The maintenance hatch 1002 has dimensions at which the scale tray 501 in which the scale plates are aggregated can be slid in and out.

Accordingly, it is possible to collectively exchange the scale tray 501 and the scale plates without detaching the X table 201 in maintenance or the like.

The following modified examples are considered.

A material of the scale tray 501 in FIG. 5 may be devised to use a material with high attenuation of bending vibration of the scale tray 501.

As the material with high vibration attenuation, there is a damping alloy, ceramics, or a resin material.

It is effective to use a material with low thermal expansion as a material of the scale tray 501 or the Y table 502. Accordingly, it is possible to further reduce a curving state of the scale plates 204, 206, and 208 due to thermal deformation of the Y table 502.

It is also effective to use a material of the elastic support member 701 with a higher heat insulating property than metal such as ceramics or resin. Accordingly, it is possible to inhibit a change in temperature of the scale tray 501 and reduce a curving state of the scale tray 501 on the Y table 502. Here, from the viewpoint of matching a difference in temperature between the scale tray 501 and the Y table 502, a heat insulating material may not be used. Therefore, it is not effective in a device in which an increase amount of temperature is large in some cases.

Finally, a semiconductor measurement device according to the embodiment will be described. The semiconductor measurement device is an example of a charged particle beam device or a vacuum device. As an example of the semiconductor measurement device, there is a length measurement scanning electron microscope (SEM) which is an application device of an SEM.

Figure 14:
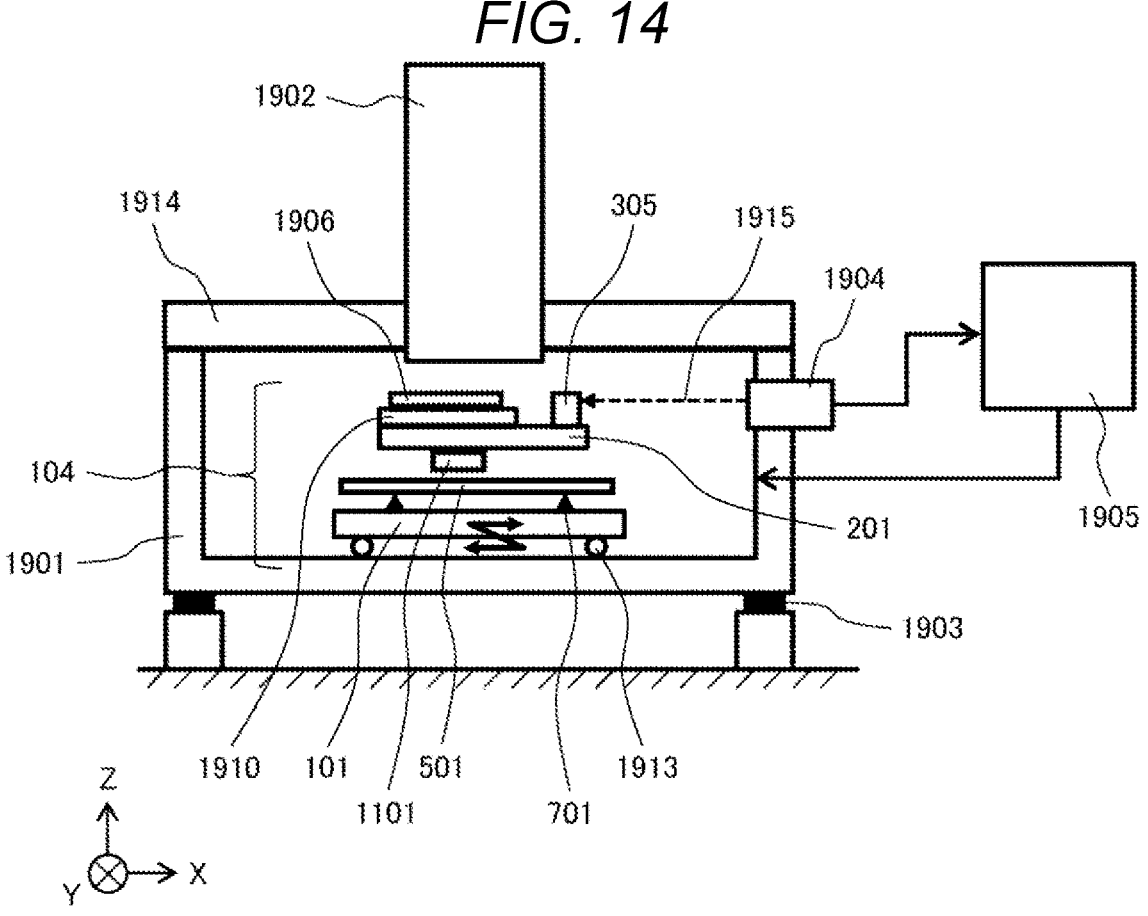
FIG. 14 is a schematic sectional view illustrating a semiconductor measurement device according to the embodiment.

FIG. 14 is a schematic sectional view illustrating a semiconductor measurement device in which a stage that has the scale tray structure according to the embodiment is installed.

The semiconductor measurement device illustrated in the drawing includes a vacuum chamber 1901 accommodating the stage device 104, an electro-optical system lens barrel 1902, a laser interferometer 1904, and a controller 1905.

The vacuum chamber 1901 accommodates the stage device 104 that positions a target 1906. A damping mount 1903 is provided in a support unit of the vacuum chamber 1901. An upper portion of the vacuum chamber 1901 is covered with a lid 1914. The vacuum chamber 1901 is internally depressurized by a vacuum pump (not illustrated) to enter a vacuum state of a pressure lower than an atmospheric pressure.

The stage device 104 includes the table 101 (the Y table), the scale tray 501, and the X table 201. A movable unit 1913 is provided on the lower surface of the table 101. The elastic support members 701 are provided between the table 101 and the scale tray 501. The elastic support members 701 support the scale tray 501. A scale head 1101 is provided on the lower surface of the X table 201. A sample stage 1910 (a sample installation unit) and the bar mirror 305 are installed on an upper portion of the X table 201. A target 1906 such as a semiconductor wafer is installed on the sample stage 1910. In the semiconductor measurement device, the target 1906 is positioned by the stage device 104, the target 1906 is irradiated with an electron beam from the electro-optical system lens barrel 1902, a pattern formed on the surface of the target 1906 is imaged, and measurement of a line width of the pattern or assessment of shape accuracy are performed. The laser interferometer 1904 irradiates the bar mirror 305 with a laser beam 1915 and detects a reflected light of the laser beam 1915. The controller 1905 measures a position of the bar mirror 305 using a detection signal of the laser interferometer 1904 and controls the positioning of the target 1906 held on the sample stage 1910.

The semiconductor measurement device according to the embodiment includes a stage device that has a scale tray structure. Accordingly, it is possible to improve positioning accuracy of a target such as a wafer. It is possible to improve inspection accuracy of the semiconductor measurement device which is a charged particle beam device. In the stage device, a levitation mechanism of the upper axis table is of a magnetic levitation type. Therefore, it is easy to make application to a semiconductor measurement device which is a vacuum device. In the scale tray structure according to the embodiment, it is possible to have no influence of thermal deformation of the lower axis table on other components. Therefore, it is possible to obtain a good advantage such as an improvement in visual field positioning accuracy when an inspection pattern is observed at a high speed because a stage is moved at a high speed and motor heating increases. An application field of the charged particle beam device and the vacuum device according to the present disclosure is not limited to the semiconductor measurement device.

According to the above-described embodiment, the magnetic levitation guide is assumed in description, but a stage device according to the present disclosure is not limited thereto and can be applied to an aerostatic guide.

Hereinafter, a preferred embodiment of the present disclosure will be described.

A stage device includes: a sample installation unit in which a positioning target is installed; a scale plate used to measure displacement of the sample installation unit in a vertical direction; and a lower axis table configured to support the scale plate from below. A free support unit is provided between the scale plate and the lower axis table. The free support unit is a unit that is relatively movable without being restricted by at least one of two members with the support unit interposed therebetween. The elastic support member 701 illustrated in FIG. 10 or the like is an example of the free support unit.

The stage device further includes a scale tray configured to fix the scale plate. A free scale tray support unit is provided between the lower axis table and the scale tray.

The scale tray is supported by two scale tray support units disposed with a gap in a longitudinal direction of the scale tray. The elastic support member 701 illustrated in FIG. 10 or the like is an example of the free scale tray support unit.

The scale tray support unit is an elastic support member.

The scale tray support unit is installed in a neutral axis of the lower axis table.

The scale tray has a U shape of which a cross section is upward opened. The scale plate is fixed to a lateral wall surface of a depression portion of the scale tray.

The scale tray is formed of a damping material.

The elastic support member is formed of a heat insulating material.

The stage device further includes an upper axis table configured to support the sample installation unit. The upper axis table has a configuration in which magnetic levitation is possible.

A charged particle beam device includes the stage device.

A vacuum device includes the stage device.

The embodiment of the present disclosure has been described above with reference to the drawings, but specific configurations are not limited to the foregoing embodiment and changes in design are included in the present disclosure within the scope of the present disclosure without departing from the gist of the present disclosure.

What is claimed is:

1. A stage device comprising:
   a sample installation unit in which a positioning target is installed;
   a scale plate used to measure displacement of the sample installation unit in a vertical direction; and
   a lower axis table configured to support the scale plate, wherein
   a free support unit is provided between the scale plate and the lower axis table.

2. The stage device according to claim 1, further comprising:

a scale tray configured to fix the scale plate, wherein
   a free scale tray support unit is provided between the lower axis table and the scale tray.

3. The stage device according to claim 2, wherein the scale tray is supported by two scale tray support units disposed with a gap in a longitudinal direction of the scale tray.

4. The stage device according to claim 2, wherein the scale tray support unit is an elastic support member.

5. The stage device according to claim 2, wherein the scale tray support unit is installed in a neutral axis of the lower axis table.

6. The stage device according to claim 2, wherein
   the scale tray has a U shape of which a cross section is upward opened, and
   the scale plate is fixed to a lateral wall surface of a depression portion of the scale tray.

7. The stage device according to claim 2, wherein the scale tray is formed of a damping material.

8. The stage device according to claim 4, wherein the elastic support member is formed of a heat insulating material.

9. The stage device according to claim 1, further comprising:
   an upper axis table configured to support the sample installation unit, wherein
   the upper axis table has a configuration in which magnetic levitation is possible.

10. A charged particle beam device comprising the stage device according to claim 1.

11. A vacuum device comprising the stage device according to claim 1.

* * * * *